United States Patent [19]

Tokunaga

[11] 4,144,500
[45] Mar. 13, 1979

[54] NOISE ELIMINATION FOR FM DEMODULATORS

[75] Inventor: Tadatsugu Tokunaga, Tokyo, Japan

[73] Assignee: Nippon Electric Co., Ltd., Tokyo, Japan

[21] Appl. No.: 802,396

[22] Filed: Jun. 1, 1977

[30] Foreign Application Priority Data

Jun. 2, 1976 [JP] Japan .................................. 51-64968

[51] Int. Cl.² .............................................. H04B 1/10
[52] U.S. Cl. .................................. 325/480; 325/348; 325/473; 328/162
[58] Field of Search ............... 325/480, 466, 472, 473, 325/474, 475, 476, 477, 478, 479, 363, 348, 349, 45; 328/162, 165; 179/1 VL, 1 P; 358/157

[56] References Cited

U.S. PATENT DOCUMENTS

| 2,761,964 | 9/1956 | Rosenzvaig | 325/348 |
| 3,226,646 | 12/1965 | Ludwig | 325/349 |
| 3,397,360 | 8/1968 | Kaneko et al. | 325/45 |
| 3,611,145 | 10/1971 | Connor | 325/473 |

*Primary Examiner*—Robert L. Griffin
*Assistant Examiner*—Tommy P. Chin
*Attorney, Agent, or Firm*—Sughrue, Rothwell, Mion, Zinn and Macpeak

[57] ABSTRACT

A system and method of noise elimination for FM demodulators for intermittent modulated carrier waves operate to remove the D.C. variation components of the output of the demodulator due to the interruption of the carrier wave.

4 Claims, 2 Drawing Figures

NOISE ELIMINATION FOR FM DEMODULATORS

BACKGROUND OF THE INVENTION

The present invention relates to noise elimination for FM demodulators adapted to demodulate intermittent frequency-modulated waves and, more particularly, to noise elimination of this kind designed to eliminate click noise in the demodulated signal that is caused by abrupt changes of D.C. components in the received carrier wave.

In some frequency-modulation communication systems, the carrier wave is transmitted, to save transmission energy, only when the transmission signal (for instance, a speech signal) is present. The output of an FM demodulator in such a communication system having an intermittent carrier wave tends to include fluctuating D.C. components, the fluctuation depending upon the presence and the absence of the carrier. Such fluctuation is attributed to the deviation of the center frequency of the FM demodulator from the carrier wave frequency. Such frequency deviation is unavoidable to a certain extent. When the carrier wave has been turned ON from its OFF state, the D.C. component of the demodulated output is changed abruptly to cause a click noise due to transient response of subsequent circuits. In one approach for eliminating this click noise, the demodulated signal is usually cut off until the click noise is sufficiently attenuated. This method, however, involved the problem of the front-end mutilation of a speech signal.

SUMMARY OF THE INVENTION

One object of the present invention is to provide simplified noise elimination of the above-mentioned click noise.

According to the present invention, there is provided a system for and method of noise elimination for FM demodulators for intermittent modulated carrier waves, characterized by comprising a detector circuit for detecting the presence of said modulated carrier wave, a low-pass filter connected to the demodulator for passing only D.C. variation components of the output of said demodulator, a delay circuit for delaying the output of said demodulator, a subtractor circuit for providing a voltage representative of the difference between the output of said low-pass filter and the output of said delay circuit, and a gate circuit connected to the output of said subtractor circuit to be actuated in response to the output of said detector circuit, whereby said D.C. variation component is eliminated by said gate circuit.

BRIEF DESCRIPTION OF THE DRAWING

Now the present invention will be described in more detail with reference to the accompanying drawing, in which.

DESCRIPTION OF THE PREFERRED EMBODIMENT

Figure 1:
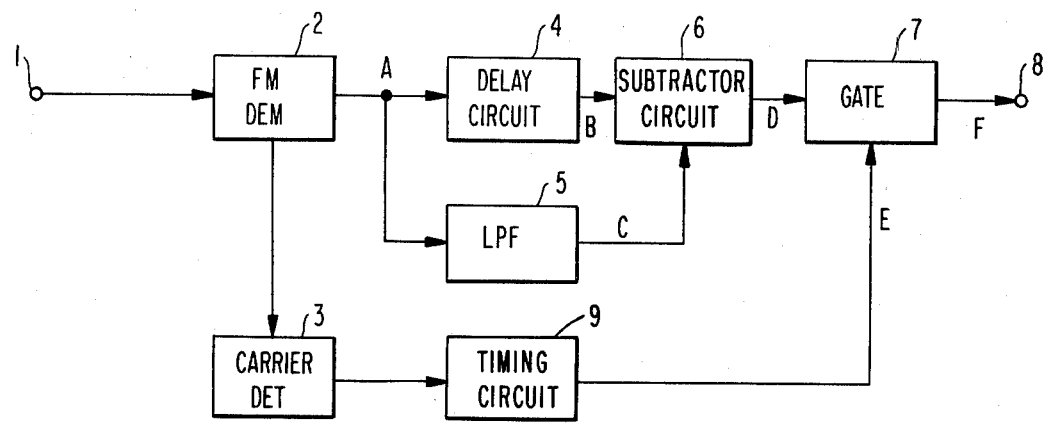
FIG. 1 is a block diagram showing the D.C. variation noise elimination system according to the present invention.
Figure 2:
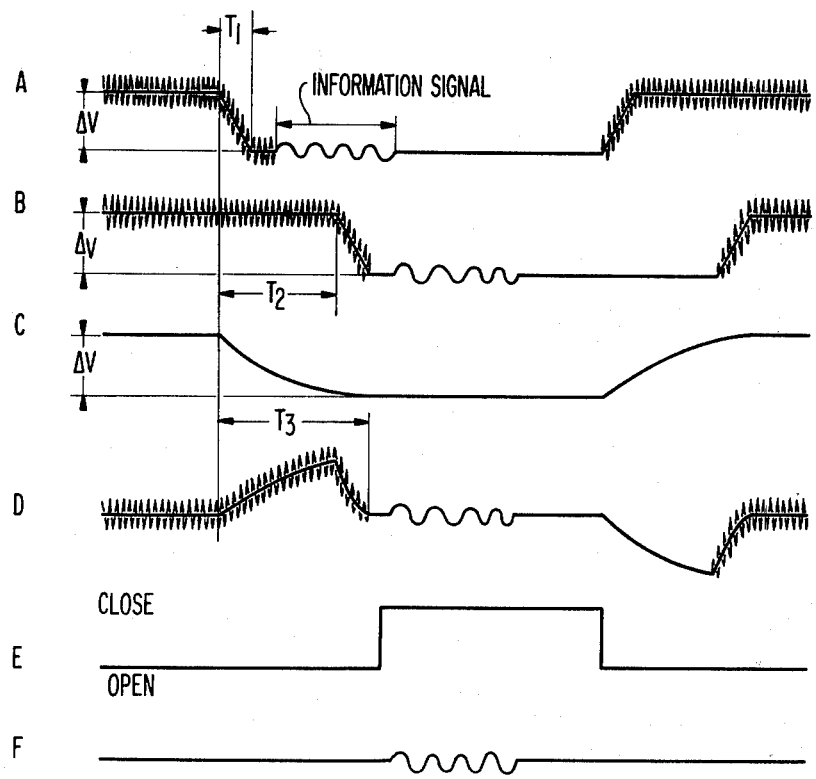
FIGS. 2A to 2F are waveform diagrams showing examples of waveforms at various points in the system shown in FIG. 1.

Referring now to FIG. 1, one preferred embodiment of the present invention is shown in block form. A frequency-modulated signal incoming at an input terminal 1 is demodulated by an FM demodulator 2. A carrier wave detector circuit 3 detects whether or not a carrier wave is present. A timing circuit 9 is inserted at the output of the detector 3 to give a proper timing to the gating operation of the gate circuit 7. A gate circuit 7 is controlled by the detector output. In case that a phase synchronizing loop system is employed as the FM demodulator 2, the system disclosed in U.S. Pat. No. 3,397,360 patented August 13, 1968 may be used as the carrier wave detector circuit. The demodulated signal from the FM demodulator 2 is fed to a delay circuit 4 and a low-pass filter circuit 5. The low-pass filter circuit 5 is for the elimination of information signal components contained in the demodulated signal. The output signals of the circuits 4 and 5, respectively, are subjected to subtraction in a substractor circuit 6 whose output is fed to the gate circuit 7. At the output of the subtractor circuit 6, a D.C. variation component of the input signal is eliminated. This mode of operation is illustrated in FIGS. 2A to 2F. With reference to FIGS. 2A, 2B and 2C represent output waveforms of the FM demodulator 2, the delay circuit 4 and the low-pass filter circuit 5, respectively. FIG. 2D represents a waveform obtained by subtracting FIG. 2C from FIG. 2B, being an input waveform of the gate circuit 7. FIG. 2E represents a waveform for controlling the gate circuit 7. FIG. 2F represents a waveform at an output terminal 8. Here it is assumed that the transient response time when the carrier wave is applied to the FM demodulator 2 is represented by $T_1$, the time constant of the low-pass filter circuit 5 is represented by $T_3$ and the delay time given by the delay circuit 4 is represented by $T_2$. When the FM demodulator 2 receives a carrier wave, a D.C. component of the output of the FM demodulator 2 is subjected to abrupt change by a voltage of $\Delta V$ that is proportional to the difference between the carrier wave frequency and the demodulator center frequency. After this abrupt change, the carrier wave begins to be demodulated. The output waveform FIG. 2B of the circuit 4 is delayed by $T_2$ with respect to the waveform FIG. 2A. The output waveform FIG. 2C from the circuit 5 is a filtered waveform having a time constant $T_3$. By subtracting the waveform FIG. 2C from the waveform FIG. 2B, at the subtractor circuit 6, the input waveform FIG. 2D for the circuit 7 can be obtained. In the waveform FIG. 2D appears a transient response when the carrier wave has been applied to the FM demodulator 2 and when it has been cut off. The time of the transient response is determined by $T_3$ or $(T_2 + T_1)$ as will be obvious from FIGS. 2A to 2F, and it becomes minimum when the relation of $T_3 = (T_2 + T_1)$ is fulfilled. The gate timing in the gate circuit 7 is set so that when the carrier wave is applied the gate may be closed after the transient response time has elapsed but when the carrier wave is interrupted the gate may be opened before the transient response starts as shown by the waveform FIG. 2E. Therefore, the click noise caused by a D.C. variation is eliminated as shown by the waveform in FIG. 2F. The above-described mode of timing for opening and closing the gate circuit 7 can be attained by closing the gate with a delay of a little longer than $T_3$ when the application of the carrier wave has been detected and by opening the gate at once when the interruption of the carrier wave has been detected.

As described above, the noise-causing D.C. variation component can be eliminated owing to the subtractor circuit, and the transient response can be also removed by appropriately selecting the timing by means of the delay circuit. Also, the timing circuit 9 may be dispensed with if the carrier wave detector circuit 3 is given the delay function. Thus, the present invention provides a simplified circuit for eliminating click noise caused by D.C. variations in and FM demodulator for intermittent carrier waves.

What is claimed is:

1. In a combination with an FM demodulator adapted to demodulate an intermittent frequency-modulated carrier wave;
    a detector circuit for detecting the presence of said modulated carrier wave;
    a low-pass filter for passing only a D.C. variation component contained in the output of said demodulator, said component being due to interruption of said modulated carrier wave;
    a delay circuit for delaying the output of said demodulator by a predetermined delay time;
    a subtractor circuit for providing a voltage representative of the difference between the outputs of said low-pass filter and said delay circuit; and
    a gate circuit connected to said subtractor circuit to be actuated in response to the output of said detector circuit, wherein the time constant of said low-pass circuit is approximately equal to the sum of the transient response time of said FM demodulator and said predetermined delay time to eliminate said D.C. variation component.

2. The combination according to claim 1 wherein said detector circuit produces a gating signal to said gate circuit commencing a period of time after the initial detection of said modulated carrier wave equal to or slightly greater than said time constant and ending when the presence of said modulated carrier wave is no longer detected.

3. A method of eliminating clock noise resulting from the demodulation of an intermittent frequency-modulated carrier wave by an FM demodulator comprising the steps of
    detecting the presence of said modulated carrier wave;
    filtering the output of said demodulator to pass only a D.C. variation component due to interruption of said carrier wave;
    delaying the demodulated output of said demodulator;
    subtracting the filtered output of said demodulator from the delayed output to produce a difference signal; and
    gating said difference signal in response to the detection of said modulated carrier wave wherein said filtering step is performed with a time constant approximately equal to the sum of the transient response time of said demodulator and the delay time of said step of delaying to eliminate said D.C. variation component.

4. The method according to claim 3 wherein the steps of gating is performed commencing a period of time after the initial detection of said modulated wave equal to or slightly greater than said time constant and ending when the presence of said modulated wave is no longer detected.

* * * * *

UNITED STATES PATENT AND TRADEMARK OFFICE
CERTIFICATE OF CORRECTION

PATENT NO. : 4,144,500
DATED : March 13, 1979
INVENTOR(S) : Tadatsugu TOKUNAGA

It is certified that error appears in the above-identified patent and that said Letters Patent are hereby corrected as shown below:

IN THE SPECIFICATION:

Column 2, line 21 - Delete "With reference to"

Column 3, line 6 - Delete "and" insert -- the --

IN THE CLAIMS:

Column 4, line 5 - Delete "clock noise" insert -- click noise --

Signed and Sealed this

Twelfth Day of June 1979

[SEAL]

Attest:

RUTH C. MASON
Attesting Officer

DONALD W. BANNER
Commissioner of Patents and Trademarks